US012704564B2

(12) United States Patent
Benfold

(10) Patent No.: US 12,704,564 B2
(45) Date of Patent: Aug. 11, 2026

(54) MAGNETOMETER HEADING ERROR ESTIMATION

(71) Applicant: Niantic Spatial, Inc., San Francisco, CA (US)

(72) Inventor: Ben Benfold, Oxford (GB)

(73) Assignee: Niantic Spatial, Inc., San Francisco, CA (US)

( * ) Notice: Subject to any disclaimer, the term of this patent is extended or adjusted under 35 U.S.C. 154(b) by 156 days.

(21) Appl. No.: 18/638,107

(22) Filed: Apr. 17, 2024

(65) Prior Publication Data

US 2025/0327883 A1 Oct. 23, 2025

(51) Int. Cl.

| | |
|---|---|
| ***G01R 33/02*** | (2006.01) |
| ***G01R 33/00*** | (2006.01) |
| ***G01R 33/028*** | (2006.01) |
| ***G01R 33/038*** | (2006.01) |
| ***G01R 33/09*** | (2006.01) |

(52) U.S. Cl.

CPC ..... *G01R 33/0206* (2013.01); *G01R 33/0005* (2013.01); *G01R 33/0052* (2013.01); *G01R 33/028* (2013.01); *G01R 33/038* (2013.01); *G01R 33/09* (2013.01); *G01R 33/096* (2013.01)

(58) Field of Classification Search

CPC ............ G01R 33/0206; G01R 33/0005; G01R 33/0052; G01R 33/028; G01R 33/038; G01R 33/09; G01R 33/096

USPC .......................................................... 324/247

See application file for complete search history.

(56) References Cited

U.S. PATENT DOCUMENTS

2010/0307016 A1* 12/2010 Mayor .................. G01R 33/10 702/179

2014/0278183 A1* 9/2014 Zheng .................. G01C 25/005 702/96

2014/0297212 A1* 10/2014 Anderson ............ G01C 25/005 702/90

2014/0303929 A1* 10/2014 Khalaf-Allah ............ G01S 5/06 702/152

(Continued)

FOREIGN PATENT DOCUMENTS

| | | |
|---|---|---|
| KR | 2014-0043466 A | 4/2014 |
| WO | WO-2017/048999 A1 | 3/2017 |

OTHER PUBLICATIONS

PCT International Search Report and Written Opinion, PCT Application No. PCT/IB2025/054083, Jul. 22, 2025, 10 pages.

*Primary Examiner* — Raul J Rios Russo

(74) *Attorney, Agent, or Firm* — Fenwick & West LLP

(57) ABSTRACT

A client device estimates an error in a heading component of a magnetometer measurement based on an error in a vertical component of the magnetometer measurement. The client device receives a three-dimensional measurement from a magnetometer including a heading and a vertical component. The client device identifies an expected vertical component based on a position of the client device and a magnetic map. The client device generates an error estimate based on the vertical component of the three-dimensional measurement and the expected vertical component. The client device compares the error to an error threshold and, in response to the error estimate being less than an error threshold, determines a pose of the client device based on the heading. The client device displays augmented reality content to the user using the pose.

17 Claims, 9 Drawing Sheets

(56) References Cited

U.S. PATENT DOCUMENTS

2016/0084659 A1* 3/2016 Yang .................... G01C 21/206
702/150
2017/0241783 A1* 8/2017 Askarpour ............. G01C 23/00
2017/0243403 A1* 8/2017 Daniels ................. G06F 3/1454
2018/0088185 A1* 3/2018 Woods .................... G06F 3/038
2018/0120109 A1 5/2018 Fite-Georgel et al.

* cited by examiner

MAGNETOMETER HEADING ERROR ESTIMATION

BACKGROUND

1. Technical Field

The subject matter described relates generally to location-based applications, and, in particular, to estimating error in magnetometer heading measurements.

2. Problem

Location-based applications provide content (e.g., augmented reality content) relating to the environment of users. To collect information on the surrounding environment, location-based applications use sensors such as cameras to capture images, GPS systems to identify locations, and magnetometers to identify poses of a client device. Magnetometer measurements may include heading data, data that describes the direction the client device is pointing. However, the magnetometer measurements may not always be accurate. Environmental factors, such as the presence of magnetic materials in and around the magnetometer may cause the magnetometer to output readings that do not represent the magnetic field of the Earth, but rather represent a magnetic field caused by nearby magnetic material. As heading measurements are typically used to compute the pose of a device, inaccurate heading measurements result in inaccurate poses. Having an accurate pose for a client device is particularly valuable for providing augmented reality (AR) content, such as AR gaming content, in that it enables the client device to present virtual content overlaid on images of the real world or the real world itself in a manner that gives the impression that the virtual objects are interacting with the real world.

SUMMARY

The present disclosure describes a method for estimating the error of magnetometer heading measurements. A client device estimates an error in a heading component of a magnetometer measurement based on an error in a vertical component of the magnetometer measurement. The client device computes the error in the vertical component by comparing the measured vertical component to an expected vertical component, given by a mapping between a location of the client device and an expected angle or magnitude of the vertical component.

In one embodiment, the client device receives a three-dimensional measurement from a magnetometer. The three-dimensional measurement includes a heading and a vertical component. The client device identifies an expected vertical component based on a position of the client device and a magnetic map. The client device generates an error estimate based on the vertical component of the three-dimensional measurement and the expected vertical component. The client device compares the error to an error threshold and, in response to the error estimate being less than an error threshold, determines a pose of the client device based on the heading. The client device displays augmented reality content to the user using the pose.

DETAILED DESCRIPTION

The figures and the following description describe certain embodiments by way of illustration only. One skilled in the art will recognize from the following description that alternative embodiments of the structures and methods may be employed without departing from the principles described. Wherever practicable, similar or like reference numbers are used in the figures to indicate similar or like functionality. Where elements share a common numeral followed by a different letter, this indicates the elements are similar or identical. A reference to the numeral alone generally refers to any one or any combination of such elements, unless the context indicates otherwise.

Various embodiments are described in the context of a parallel reality game that includes augmented reality content in a virtual world geography that parallels at least a portion of the real-world geography such that player movement and actions in the real-world affect actions in the virtual world. The subject matter described is applicable in other situations where estimating the error of magnetometer heading measurements is desirable. In addition, the inherent flexibility of computer-based systems allows for a great variety of possible configurations, combinations, and divisions of tasks and functionality between and among the components of the system.

Example Location-Based Parallel Reality Game

Figure 1:
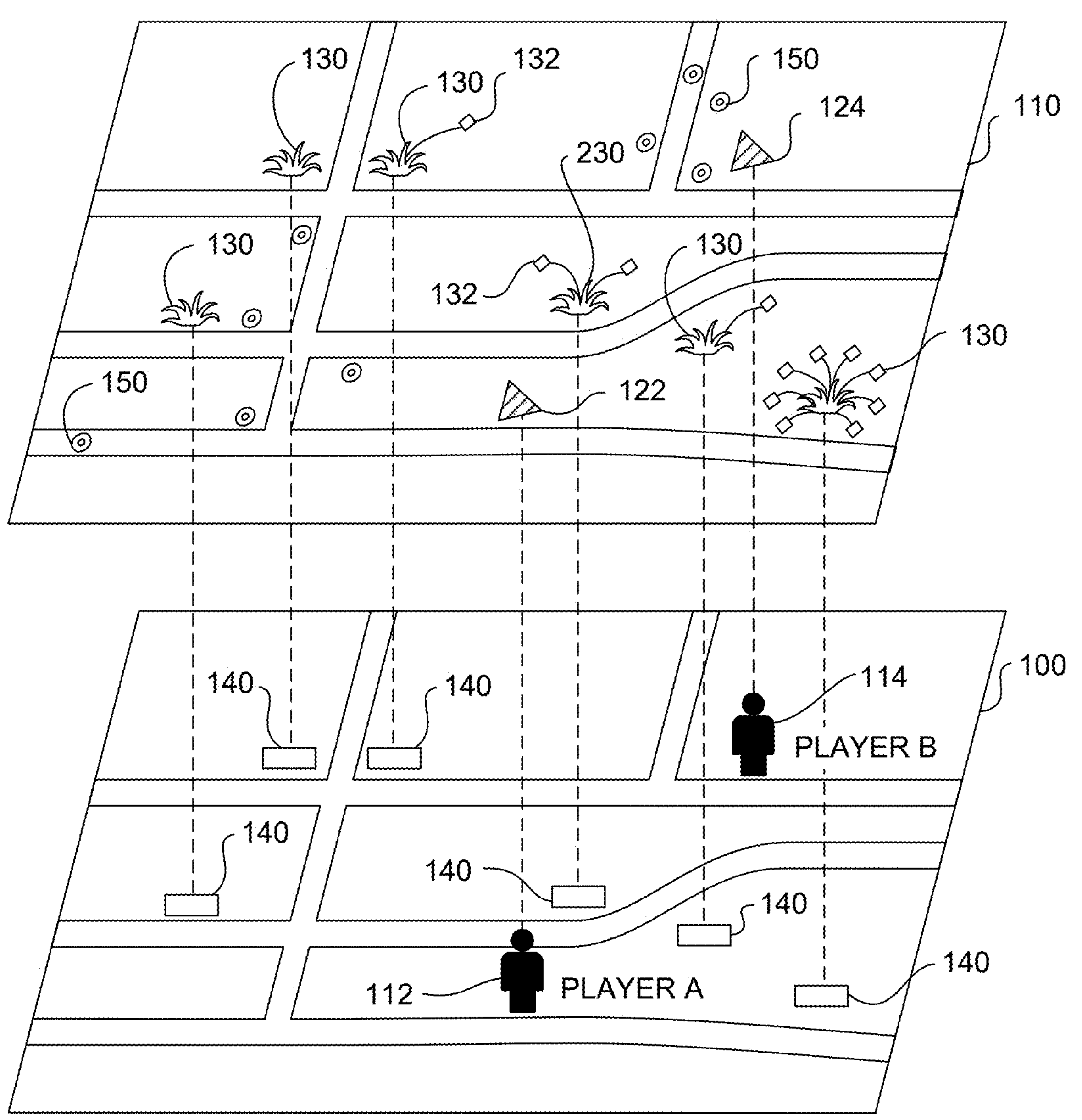
FIG. 1 depicts a representation of a virtual world having a geography that parallels the real world, according to one embodiment.

FIG. 1 is a conceptual diagram of a virtual world 110 that parallels the real world 100. The virtual world 110 can act as the game board for players of a parallel reality game. As illustrated, the virtual world 110 includes a geography that parallels the geography of the real world 100. In particular, a range of coordinates defining a geographic area or space in the real world 100 is mapped to a corresponding range of coordinates defining a virtual space in the virtual world 110. The range of coordinates in the real world 100 can be associated with a town, neighborhood, city, campus, locale, a country, continent, the entire globe, or other geographic area. Each geographic coordinate in the range of geographic coordinates is mapped to a corresponding coordinate in a virtual space in the virtual world 110.

A player's position in the virtual world 110 corresponds to the player's position in the real world 100. For instance, player A located at position 112 in the real world 100 has a corresponding position 122 in the virtual world 110. Similarly, player B located at position 114 in the real world 100 has a corresponding position 124 in the virtual world 110. As the players move about in a range of geographic coordinates in the real world 100, the players also move about in the range of coordinates defining the virtual space in the virtual world 110. In particular, a positioning system (e.g., a GPS system, a localization system, or both) associated with a mobile computing device carried by the player can be used to track a player's position as the player navigates the range of geographic coordinates in the real world 100. Data associated with the player's position in the real world 100 is used to update the player's position in the corresponding range of coordinates defining the virtual space in the virtual world 110. In this manner, players can navigate along a continuous track in the range of coordinates defining the virtual space in the virtual world 110 by simply traveling among the corresponding range of geographic coordinates in the real world 100 without having to check in or periodically update location information at specific discrete locations in the real world 100.

The location-based game can include game objectives requiring players to travel to or interact with various virtual elements or virtual objects scattered at various virtual locations in the virtual world 110. A player can travel to these virtual locations by traveling to the corresponding location of the virtual elements or objects in the real world 100. For instance, a positioning system can track the position of the player such that as the player navigates the real world 100, the player also navigates the parallel virtual world 110. The player can then interact with various virtual elements and objects at the specific location to achieve or perform one or more game objectives.

A game objective may have players interacting with virtual elements 130 located at various virtual locations in the virtual world 110. These virtual elements 130 can be linked to landmarks, geographic locations, or objects 140 in the real world 100. The real-world landmarks or objects 140 can be works of art, monuments, buildings, businesses, libraries, museums, or other suitable real-world landmarks or objects. Interactions include capturing, claiming ownership of, using some virtual item, spending some virtual currency, etc. To capture these virtual elements 130, a player travels to the landmark or geographic locations 140 linked to the virtual elements 130 in the real world and performs any necessary interactions (as defined by the game's rules) with the virtual elements 130 in the virtual world 110. For example, player A may have to travel to a landmark 140 in the real world 100 to interact with or capture a virtual element 130 linked with that particular landmark 140. The interaction with the virtual element 130 can require action in the real world, such as taking a photograph or verifying, obtaining, or capturing other information about the landmark or object 140 associated with the virtual element 130.

Game objectives may require that players use one or more virtual items that are collected by the players in the location-based game. For instance, the players may travel the virtual world 110 seeking virtual items 132 (e.g., weapons, creatures, power ups, or other items) that can be useful for completing game objectives. These virtual items 132 can be found or collected by traveling to different locations in the real world 100 or by completing various actions in either the virtual world 110 or the real world 100 (such as interacting with virtual elements 130, battling non-player characters or other players, or completing quests, etc.). In the example shown in FIG. 1, a player uses virtual items 132 to capture one or more virtual elements 130. In particular, a player can deploy virtual items 132 at locations in the virtual world 110 near to or within the virtual elements 130. Deploying one or more virtual items 132 in this manner can result in the capture of the virtual element 130 for the player or for the team/faction of the player.

In one particular implementation, a player may have to gather virtual energy as part of the parallel reality game. Virtual energy 150 can be scattered at different locations in the virtual world 110. A player can collect the virtual energy 150 by traveling to (or within a threshold distance of) the location in the real world 100 that corresponds to the location of the virtual energy in the virtual world 110. The virtual energy 150 can be used to power virtual items or perform various game objectives in the game. A player that loses all virtual energy 150 may be disconnected from the game or prevented from playing for a certain amount of time or until they have collected additional virtual energy 150.

According to aspects of the present disclosure, the parallel reality game can be a massive multi-player location-based game where every participant in the game shares the same virtual world. The players can be divided into separate teams or factions and can work together to achieve one or more game objectives, such as to capture or claim ownership of a virtual element. In this manner, the parallel reality game can intrinsically be a social game that encourages cooperation among players within the game. Players from opposing teams can work against each other (or sometime collaborate to achieve mutual objectives) during the parallel reality game. A player may use virtual items to attack or impede progress of players on opposing teams. In some cases, players are encouraged to congregate at real world locations for cooperative or interactive events in the parallel reality game. In these cases, the game server seeks to ensure players are indeed physically present and not spoofing their locations.

Figure 2:
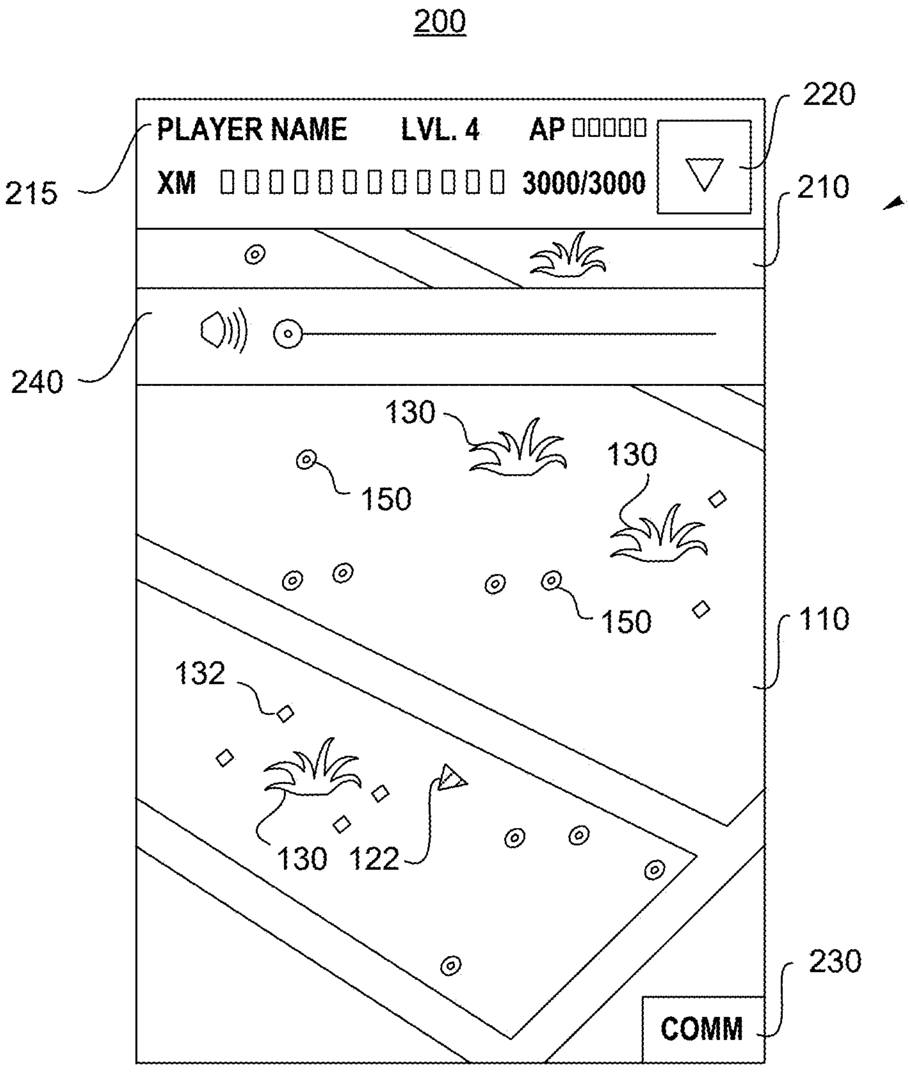
FIG. 2 depicts an exemplary interface of a parallel reality game, according to one embodiment.

FIG. 2 depicts one embodiment of a game interface 200 that can be presented (e.g., on a player's smartphone) as part of the interface between the player and the virtual world 110. The game interface 200 includes a display window 210 that can be used to display the virtual world 110 and various other aspects of the game, such as player position 122 and the locations of virtual elements 130, virtual items 132, and virtual energy 150 in the virtual world 110. The user interface 200 can also display other information, such as game data information, game communications, player information, client location verification instructions and other information associated with the game. For example, the user interface can display player information 215, such as player name, experience level, and other information. The user interface 200 can include a menu 220 for accessing various game settings and other information associated with the game. The user interface 200 can also include a communications interface 230 that enables communications between the game system and the player and between one or more players of the parallel reality game.

According to aspects of the present disclosure, a player can interact with the parallel reality game by carrying a client device around in the real world. For instance, a player can play the game by accessing an application associated with the parallel reality game on a smartphone and moving about in the real world with the smartphone. In this regard, it is not necessary for the player to continuously view a visual representation of the virtual world on a display screen in order to play the location-based game. As a result, the user interface 200 can include non-visual elements that allow a user to interact with the game. For instance, the game interface can provide audible notifications to the player when the player is approaching a virtual element or object in the game or when an important event happens in the parallel reality game. In some embodiments, a player can control these audible notifications with audio control 240. Different types of audible notifications can be provided to the user depending on the type of virtual element or event. The audible notification can increase or decrease in frequency or volume depending on a player's proximity to a virtual element or object. Other non-visual notifications and signals can be provided to the user, such as a vibratory notification or other suitable notifications or signals.

The parallel reality game can have various features to enhance and encourage game play within the parallel reality game. For instance, players can accumulate a virtual currency or another virtual reward (e.g., virtual tokens, virtual points, virtual material resources, etc.) that can be used throughout the game (e.g., to purchase in-game items, to redeem other items, to craft items, etc.). Players can advance through various levels as the players complete one or more game objectives and gain experience within the game. Players may also be able to obtain enhanced "powers" or virtual items that can be used to complete game objectives within the game.

Those of ordinary skill in the art, using the disclosures provided, will appreciate that numerous game interface configurations and underlying functionalities are possible. The present disclosure is not intended to be limited to any one particular configuration unless it is explicitly stated to the contrary.

Example Gaming System

Figure 3:
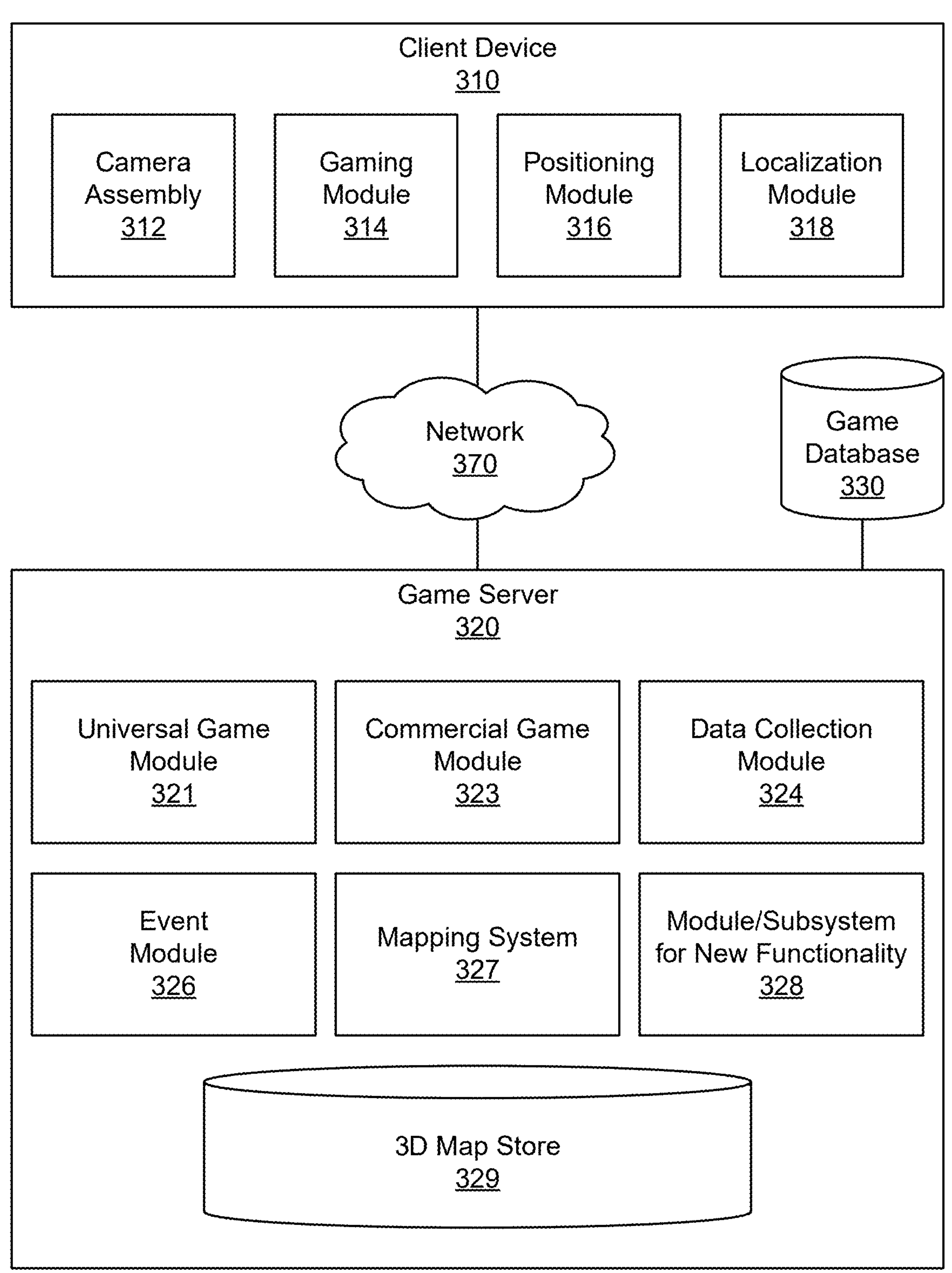
FIG. 3 is a block diagram of a networked computing environment in which the error of magnetometer heading measurements may be measured and used, according to one embodiment.

FIG. 3 illustrates one embodiment of a networked computing environment 300. The networked computing environment 300 uses a client-server architecture, where a game server 320 communicates with a client device 310 over a network 370 to provide a parallel reality game to a player at the client device 310. The networked computing environment 300 also may include other external systems such as sponsor/advertiser systems or business systems. Although only one client device 310 is shown in FIG. 3, any number of client devices 310 or other external systems may be connected to the game server 320 over the network 370. Furthermore, the networked computing environment 300 may contain different or additional elements and functionality may be distributed between the client device 310 and the server 320 in different manners than described below.

The networked computing environment 300 provides for the interaction of players in a virtual world having a geography that parallels the real world. In particular, a geographic area in the real world can be linked or mapped directly to a corresponding area in the virtual world. A player can move about in the virtual world by moving to various geographic locations in the real world. For instance, a player's position in the real world can be tracked and used to update the player's position in the virtual world. Typically, the player's position in the real world is determined by finding the location of a client device 310 through which the player is interacting with the virtual world and assuming the player is at the same (or approximately the same) location. For example, in various embodiments, the player may interact with a virtual element if the player's location in the real world is within a threshold distance (e.g., ten meters, twenty meters, etc.) of the real-world location that corresponds to the virtual location of the virtual element in the virtual world. For convenience, various embodiments are described with reference to "the player's location" but one of skill in the art will appreciate that such references may refer to the location of the player's client device 310.

A client device 310 can be any portable computing device capable for use by a player to interface with the game server 320. For instance, a client device 310 is preferably a portable wireless device that can be carried by a player, such as a smartphone, portable gaming device, augmented reality (AR) headset, cellular phone, tablet, personal digital assistant (PDA), navigation system, handheld GPS system, or other such device. For some use cases, the client device 310 may be a less-mobile device such as a desktop or a laptop computer. Furthermore, the client device 310 may be a vehicle with a built-in computing device.

The client device 310 communicates with the game server 320 to provide sensory data of a physical environment. In one embodiment, the client device 310 includes a camera assembly 312, a gaming module 314, a positioning module 316, and a localization module 318. The client device 310 also includes a network interface (not shown) for providing communications over the network 370. In various embodiments, the client device 310 may include different or additional components, such as additional sensors, display, and software modules, etc.

The camera assembly 312 includes one or more cameras which can capture image data. The cameras capture image data describing a scene of the environment surrounding the client device 310 with a particular pose (the location and orientation of the camera within the environment). The camera assembly 312 may use a variety of photo sensors with varying color capture ranges and varying capture rates. Similarly, the camera assembly 312 may include cameras with a range of different lenses, such as a wide-angle lens or a telephoto lens. The camera assembly 312 may be configured to capture single images or multiple images as frames of a video.

The client device 310 may also include additional sensors for collecting data regarding the environment surrounding the client device, such as movement sensors, accelerometers, magnetometers, gyroscopes, barometers, thermometers, light sensors, microphones, etc. The image data captured by the camera assembly 312 can be appended with metadata describing other information about the image data, such as additional sensory data (e.g., temperature, brightness of environment, air pressure, location, pose etc.) or capture data (e.g., exposure length, shutter speed, focal length, capture time, etc.).

The gaming module 314 provides a player with an interface to participate in the parallel reality game. The game server 320 transmits game data over the network 370 to the client device 310 for use by the gaming module 314 to provide a local version of the game to a player at locations remote from the game server. In one embodiment, the gaming module 314 presents a user interface on a display of the client device 310 that depicts a virtual world (e.g., renders imagery of the virtual world) and allows a user to interact with the virtual world to perform various game objectives. In some embodiments, the gaming module 314 presents images of the real world (e.g., captured by the camera assembly 312) augmented with virtual elements from the parallel reality game. In these embodiments, the gaming module 314 may generate or adjust virtual content according to other information received from other components of the client device 310. For example, the gaming module 314 may adjust a virtual object to be displayed on the user interface according to a depth map of the scene captured in the image data.

The gaming module 314 can also control various other outputs to allow a player to interact with the game without requiring the player to view a display screen. For instance, the gaming module 314 can control various audio, vibratory, or other notifications that allow the player to play the game without looking at the display screen.

The positioning module 316 can be any device or circuitry for determining the position of the client device 310. For example, the positioning module 316 can determine actual or relative position by using a satellite navigation positioning system (e.g., a GPS system, a Galileo positioning system, the Global Navigation satellite system (GLONASS), the BeiDou Satellite Navigation and Positioning system), an inertial navigation system, a dead reckoning system, IP address analysis, triangulation and/or proximity to cellular towers or Wi-Fi hotspots, or other suitable techniques.

As the player moves around with the client device 310 in the real world, the positioning module 316 tracks the position of the player and provides the player position information to the gaming module 314. The gaming module 314 updates the player position in the virtual world associated with the game based on the actual position of the player in the real world. Thus, a player can interact with the virtual world simply by carrying or transporting the client device 310 in the real world. In particular, the location of the player in the virtual world can correspond to the location of the player in the real world. The gaming module 314 can provide player position information to the game server 320 over the network 370. In response, the game server 320 may enact various techniques to verify the location of the client device 310 to prevent cheaters from spoofing their locations. It should be understood that location information associated with a player is utilized only if permission is granted after the player has been notified that location information of the player is to be accessed and how the location information is to be utilized in the context of the game (e.g., to update player position in the virtual world). In addition, any location information associated with players is stored and maintained in a manner to protect player privacy.

Figure 4:
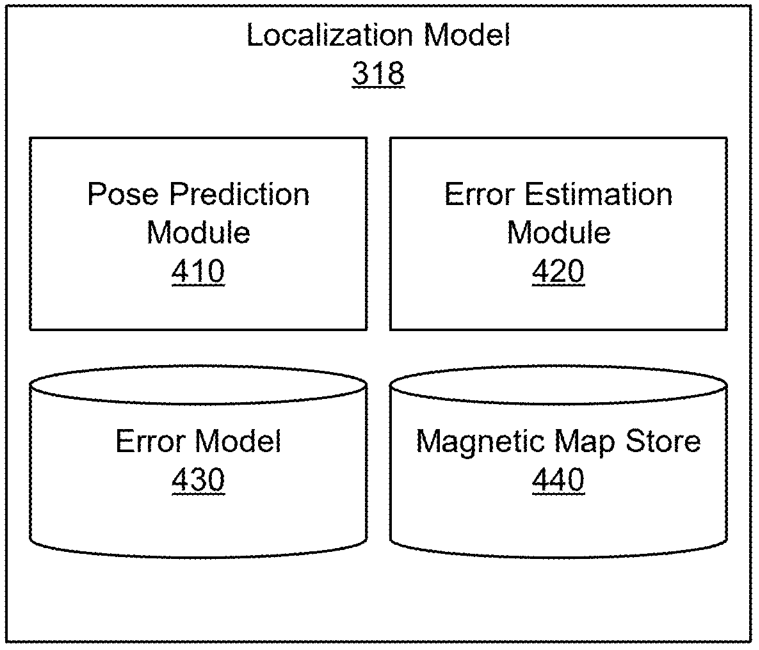
FIG. 4 is a block diagram of the localization module shown in FIG. 3, according to one embodiment.

The localization module 318 provides an additional or alternative way to determine the location of the client device 310. FIG. 4 illustrates one embodiment of the localization module 318. The localization module includes a pose prediction module 410, an error estimation module 420, an error model 430, and a magnetic map store 440.

The pose prediction module 410 determines the pose of the client device 310. In one embodiment, the pose prediction module 410 receives the location determined for the client device 310 by the positioning module 316 and refines it by determining a pose of one or more cameras of the camera assembly 312. The pose prediction module 410 may use the location generated by the positioning module 316 to select a 3D map of the environment surrounding the client device 310 and localize against the 3D map. The pose prediction module 410 may obtain the 3D map from local storage or from the game server 320. The 3D map may be a point cloud, mesh, or any other suitable 3D representation of the environment surrounding the client device 310. Alternatively, the pose prediction module 410 may determine a location or pose of the client device 310 without reference to a coarse location (such as one provided by a GPS system), such as by determining the relative location of the client device 310 to another device.

In one embodiment, the pose prediction module 410 applies a trained pose model to determine the pose of images captured by the camera assembly 312 relative to the 3D map. Thus, the pose prediction module 410 can determine an accurate (e.g., to within a few centimeters and degrees) determination of the position and orientation of the client device 310. The position of the client device 310 can then be tracked over time using dead reckoning based on sensor readings, periodic re-localization, or a combination of both. Having an accurate pose for the client device 310 may enable the gaming module 314 to present virtual content overlaid on images of the real world (e.g., by displaying virtual elements in conjunction with a real-time feed from the camera assembly 312 on a display) or the real world itself (e.g., by displaying virtual elements on a transparent display of an AR headset) in a manner that gives the impression that the virtual objects are interacting with the real world. For example, a virtual character may hide behind a real tree, a virtual hat may be placed on a real statue, or a virtual creature may run and hide if a real person approaches it too quickly.

In some embodiments, the pose prediction module 410 determines the pose of the client device 310 using a heading. The heading is a vector tangent to the surface of the Earth and corresponding to a compass direction in which the client device 310 points. For example, for an aircraft, the heading may correspond to the compass direction of the aircraft's nose. For a moving client device 310, the heading may be different from the direction the client device 310 moves, known as the course. The pose prediction module 410 may use the heading along with the location generated by the positioning module 316 to select a 3D map of the environment surrounding the client device 310 and localize against the 3D map. The pose prediction module 410 may use the heading as an additional input to the trained pose model.

The pose prediction module 410 may receive the heading from a magnetometer (e.g., a compass). The magnetometer measures changes in the Earth's magnetic field and includes measurements in three dimensions. The magnetometer may be part of the client device 310 (e.g., part of a mobile phone's inertial measurement unit (IMU)). The magnetometer may produce a three-dimensional measurement, including the heading and a vertical component. The vertical component may be a component of the three-dimensional vector measured relative to gravity. The vertical component may be a vector orthogonal to the surface of the Earth.

In some embodiments, the pose prediction module 410 adjusts the three-dimensional magnetometer measurement such that the vertical component is measured relative to a gravity vector. The pose prediction module 410 identifies the "up-direction" by using an accelerometer to identify a direction in which acceleration is equal to the acceleration due to gravity. The pose prediction module 410 may use gyroscope data to correct for the pitch, roll, and yaw of the magnetometer or client device 310. Additionally or alternatively, the pose prediction module 410 may use image data to determine the up-direction, for example identifying a direction corresponding to the sky and a direction corresponding to the ground.

Regardless of how it is identified, the pose prediction module 410 may adjust the vertical component based on the identified up-direction. However, the magnetometer measurements may not always be accurate. Environmental factors, such as the presence of magnetic materials in and around the magnetometer may cause the magnetometer to output readings that do not represent the magnetic field of the Earth, but rather represent a magnetic field caused by nearby magnetic material. For example, if the client device 310 passes by a vehicle, the magnetometer reading may be affected by the magnetic material of the vehicle. Inaccurate magnetometer readings lead to inaccuracies in heading measurements, which may cause the pose prediction module 410 to inaccurately compute the pose of the client device 310.

The error estimation module 420 estimates an error in the heading of the magnetometer based on the three-dimensional magnetometer measurement. As disturbance in the magnetic field usually affects both horizontal and vertical components of a magnetometer reading, the error in the vertical component of the measurement may serve as a proxy or estimation of the error in the heading. Likewise, the error in the three-dimensional measurement may server as a proxy or estimation of the error in the heading. The error estimation module 420 may estimate the error in the heading based on the magnitude or direction of the three-dimensional measurement, the magnitude or direction of one or more components of the three-dimensional measurement (e.g., the vertical component), or any combination thereof.

Figure 7:
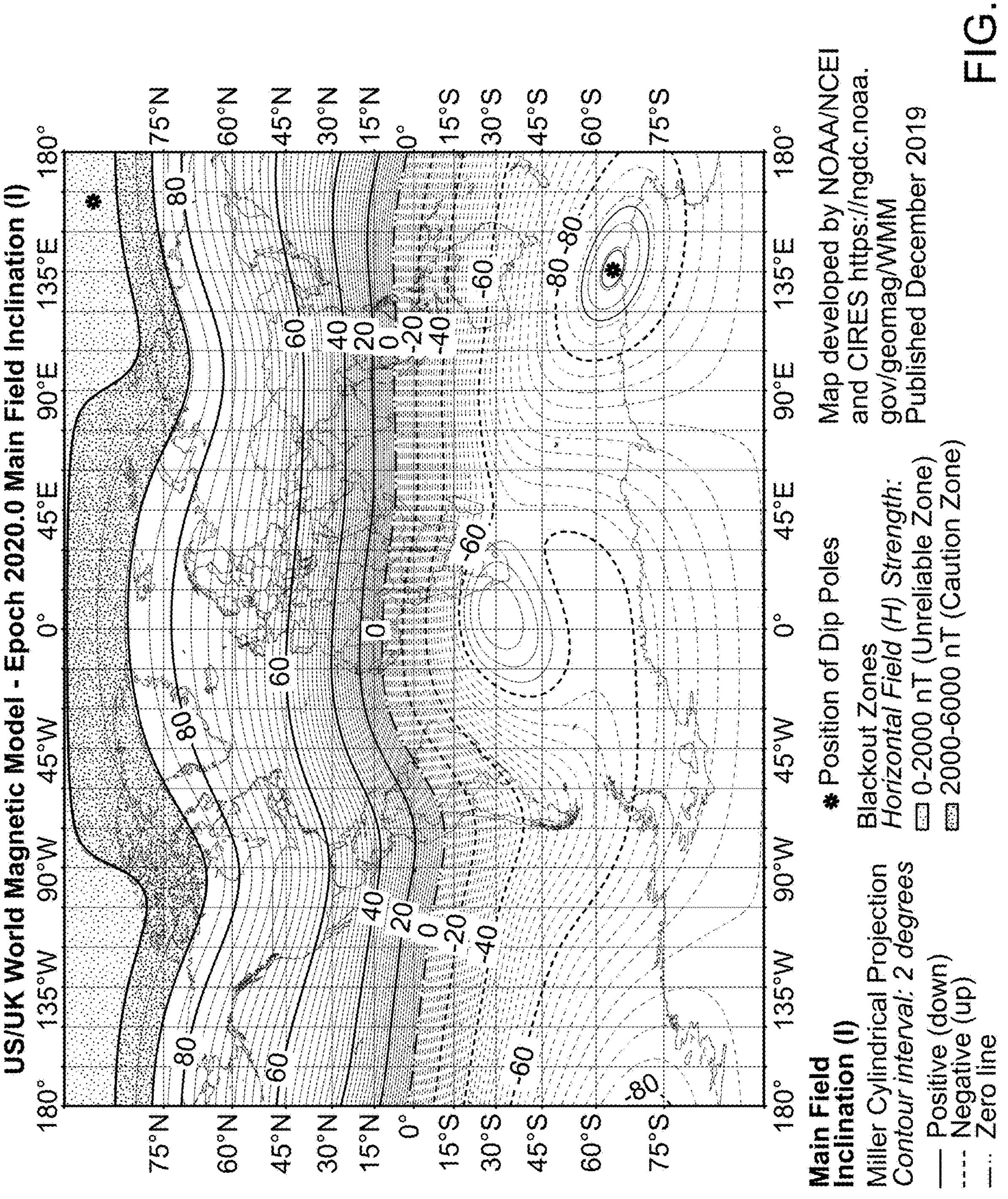
FIG. 7 is an example of a magnetic inclination map, according to one embodiment.

In some embodiments, the error estimation module 420 estimates the error in the heading based on an error in the angle of the vertical component of the three-dimensional measurement. The error estimation module 420 identifies an expected angle of the vertical component to which the measured angle of the vertical component may be compared. The error estimation module 420 identifies the expected angle of the vertical component using a mapping, such as a magnetic inclination map, and a position of the client device. The magnetic inclination map maps positions on Earth to vertical angles of the Earth's magnetic field, or the "attitude" or "inclination." At the magnetic north pole, the magnetic inclination is 90 degrees. At the magnetic south pole, the magnetic inclination is −90 degrees. The error estimation module 420 may retrieve the mapping from a public database, for example the World Magnetic Model (WMM). The mapping may be stored at the magnetic map store 440. An example of the magnetic inclination map from the WMM is shown at FIG. 7. The error estimation module 420 identifies the position of the client device from the positioning module 316. The position may be GPS coordinates. Using the position and the mapping, the error estimation module 420 identifies the expected angle of the vertical component.

The error estimation module 420 computes an error in the angle of the vertical component by comparing the angle of the vertical component measured by the magnetometer to the expected angle of the vertical component given by the magnetic inclination map at the position of the client device 310. For example, say a magnetometer on a client device in southern England takes a measurement with a vertical component that has an angle of 20 degrees. The error estimation module 420 uses the magnetic inclination map and the position (a location in southern England) to identify that the expected vertical component has an angle of 67 degrees. The error estimation module 420 computes the error as 47 degrees, the difference between the expected and measurement angles. The error estimation module 420 may estimate the error in the heading based on the error in the vertical component.

Figure 8:
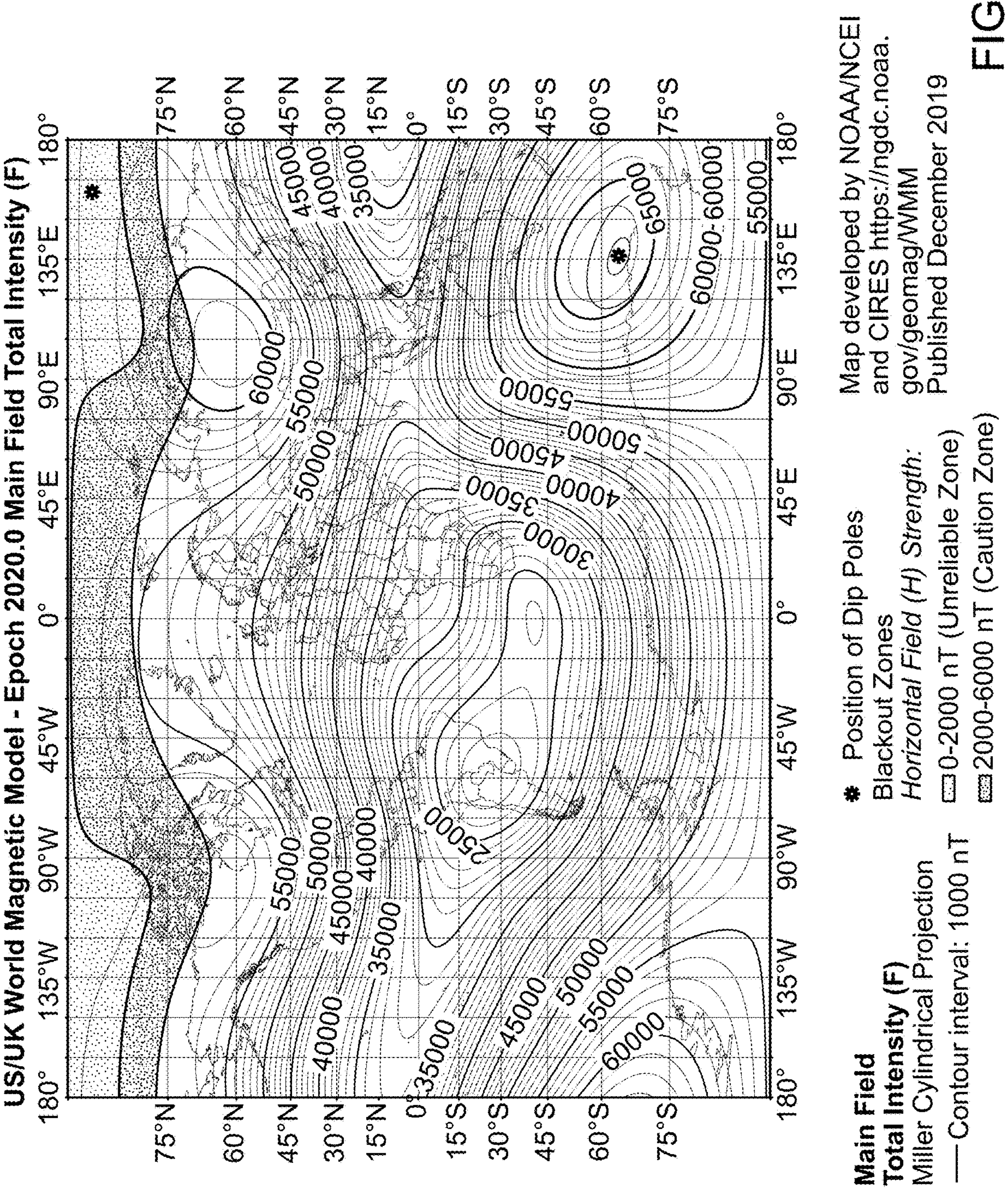
FIG. 8 is an example of a magnetic field strength map, according to one embodiment.

In some embodiments, the error estimation module 420 estimates the error in the heading based on an error in the magnitude of the three-dimensional measurement. The error estimation module 420 identifies the expected magnitude using a mapping, such as a magnetic field strength map. The magnetic field strength map maps positions on Earth to the magnitude of Earth's magnetic field. The error estimation module 420 may retrieve the mapping from a public database, for example the World Magnetic Model (WMM). The mapping may be stored at the magnetic map store 440. An example of the magnetic field strength map from the WMM is shown at FIG. 8. The error estimation module 420 identifies the position of the client device from the positioning module 316. Using the position and the mapping, the error estimation module 420 identifies the expected magnitude of the three-dimensional measurement. The error estimation module 420 computes an error in the magnitude by comparing measured magnitude to the expected magnitude. The error estimation module 420 may estimate the error in the heading based on the error in the magnitude of the three-dimensional component.

In some embodiments, the error estimation module 420 estimates the error in the heading by applying an error model (e.g., error model 430) to the measured vertical component and expected vertical component. The error model 430 may be a machine learning model trained to receive as input measured and expected vertical components and output an estimated error heading. The error estimation module 420 may provide the error model 430 with additional information, such as accelerometer data, position data, or image data that describes the environment around the client device (e.g., if there is a magnetic object in view). The error model 430 may alternatively be a normal distribution, for example a normal distribution centered around the expected vertical component (e.g., the magnetic inclination or magnetic field strength at the position of the client device). The error model 430 may be a Bayesian model that estimates the probability that the measured heading is correct.

The pose prediction module 410 may use the estimated error in the heading to inform how the heading is used in calculation of the client device's pose. In some embodiments, the pose prediction module 410 may ignore heading measurements with high error values. For example, the magnetometer may take a set of measurements while the client device is in a fixed location. The fixed location may be defined by thresholds, such as a threshold defining that measurements within one foot of each other are considered to be in the same fixed location. The pose prediction module 410 may estimate the heading error for each of the measurements in the set and determine that for a subset of the measurements, the heading error is higher than a threshold value (e.g., 5 degrees, 5 μT, one standard deviation). The pose prediction module 410 may ignore the subset of measurements with heading error higher than the threshold value and use the measurements with heading error below the threshold value to compute the pose of the client device. In some embodiments, the pose prediction module 410 may weight heading measurements according to their associated error values. Referring to the same example as above, the pose prediction module 410 may weight headings with high error lower in a pose calculation and weight headings with low error higher in a pose calculation. In some embodiments, the pose prediction module 410 may use the heading value with the lowest error in the pose calculation and ignore other heading values.

The game server 320 includes one or more computing devices that provide game functionality to the client device 310. The game server 320 can include or be in communication with a game database 330. The game database 330 stores game data used in the parallel reality game to be served or provided to the client device 310 over the network 370.

The game data stored in the game database 330 can include: (1) data associated with the virtual world in the parallel reality game (e.g., image data used to render the virtual world on a display device, geographic coordinates of locations in the virtual world, etc.); (2) data associated with players of the parallel reality game (e.g., player profiles including but not limited to player information, player experience level, player currency, current player positions in the virtual world/real world, player energy level, player preferences, team information, faction information, etc.); (3) data associated with game objectives (e.g., data associated with current game objectives, status of game objectives, past game objectives, future game objectives, desired game objectives, etc.); (4) data associated with virtual elements in the virtual world (e.g., positions of virtual elements, types of virtual elements, game objectives associated with virtual elements; corresponding actual world position information for virtual elements; behavior of virtual elements, relevance of virtual elements etc.); (5) data associated with real-world objects, landmarks, positions linked to virtual-world elements (e.g., location of real-world objects/landmarks, description of real-world objects/landmarks, relevance of virtual elements linked to real-world objects, etc.); (6) game status (e.g., current number of players, current status of game objectives, player leaderboard, etc.); (7) data associated with player actions/input (e.g., current player positions, past player positions, player moves, player input, player queries, player communications, etc.); or (8) any other data used, related to, or obtained during implementation of the parallel reality game. The game data stored in the game database 330 can be populated either offline or in real time by system administrators or by data received from users (e.g., players), such as from a client device 310 over the network 370.

In one embodiment, the game server 320 is configured to receive requests for game data from a client device 310 (for instance via remote procedure calls (RPCs)) and to respond to those requests via the network 370. The game server 320 can encode game data in one or more data files and provide the data files to the client device 310. In addition, the game server 320 can be configured to receive game data (e.g., player positions, player actions, player input, etc.) from a client device 310 via the network 370. The client device 310 can be configured to periodically send player input and other updates to the game server 320, which the game server uses to update game data in the game database 330 to reflect any and all changed conditions for the game.

In the embodiment shown in FIG. 3, the game server 320 includes a universal game module 322, a commercial game module 323, a data collection module 324, an event module 326, a mapping system 327, and a 3D map store 329. As mentioned above, the game server 320 interacts with a game database 330 that may be part of the game server or accessed remotely (e.g., the game database 330 may be a distributed database accessed via the network 370). In other embodiments, the game server 320 contains different or additional elements. In addition, the functions may be distributed among the elements in a different manner than described.

The universal game module 322 hosts an instance of the parallel reality game for a set of players (e.g., all players of the parallel reality game) and acts as the authoritative source for the current status of the parallel reality game for the set of players. As the host, the universal game module 322 generates game content for presentation to players (e.g., via their respective client devices 310). The universal game module 322 may access the game database 330 to retrieve or store game data when hosting the parallel reality game. The universal game module 322 may also receive game data from client devices 310 (e.g., depth information, player input, player position, player actions, landmark information, etc.) and incorporates the game data received into the overall parallel reality game for the entire set of players of the parallel reality game. The universal game module 322 can also manage the delivery of game data to the client device 310 over the network 370. In some embodiments, the universal game module 322 also governs security aspects of the interaction of the client device 310 with the parallel reality game, such as securing connections between the client device and the game server 320, establishing connections between various client devices, or verifying the location of the various client devices 310 to prevent players cheating by spoofing their location.

The commercial game module 323 can be separate from or a part of the universal game module 322. The commercial game module 323 can manage the inclusion of various game features within the parallel reality game that are linked with a commercial activity in the real world. For instance, the commercial game module 323 can receive requests from external systems such as sponsors/advertisers, businesses, or other entities over the network 370 to include game features linked with commercial activity in the real world. The commercial game module 323 can then arrange for the inclusion of these game features in the parallel reality game on confirming the linked commercial activity has occurred. For example, if a business pays the provider of the parallel reality game an agreed upon amount, a virtual object identifying the business may appear in the parallel reality game at a virtual location corresponding to a real-world location of the business (e.g., a store or restaurant).

The data collection module 324 can be separate from or a part of the universal game module 322. The data collection module 324 can manage the inclusion of various game features within the parallel reality game that are linked with a data collection activity in the real world. For instance, the data collection module 324 can modify game data stored in the game database 330 to include game features linked with data collection activity in the parallel reality game. The data collection module 324 can also analyze data collected by players pursuant to the data collection activity and provide the data for access by various platforms.

The event module 326 manages player access to events in the parallel reality game. Although the term "event" is used for convenience, it should be appreciated that this term need not refer to a specific event at a specific location or time. Rather, it may refer to any provision of access-controlled game content where one or more access criteria are used to determine whether players may access that content. Such content may be part of a larger parallel reality game that includes game content with less or no access control or may be a stand-alone, access controlled parallel reality game.

The mapping system 327 generates a 3D map of a geographical region based on a set of images. The 3D map may be a point cloud, polygon mesh, or any other suitable representation of the 3D geometry of the geographical region. The 3D map may include semantic labels providing additional contextual information, such as identifying objects tables, chairs, clocks, lampposts, trees, etc.), materials (concrete, water, brick, grass, etc.), or game properties (e.g., traversable by characters, suitable for certain in-game actions, etc.). In one embodiment, the mapping system 327 stores the 3D map along with any semantic/contextual information in the 3D map store 329. The 3D map may be stored in the 3D map store 329 in conjunction with location information (e.g., GPS coordinates of the center of the 3D map, a ringfence defining the extent of the 3D map, or the like). Thus, the game server 320 can provide the 3D map to client devices 310 that provide location data indicating they are within or near the geographic area covered by the 3D map.

The network 370 can be any type of communications network, such as a local area network (e.g., an intranet), wide area network (e.g., the internet), or some combination thereof. The network can also include a direct connection between a client device 310 and the game server 320. In general, communication between the game server 320 and a client device 310 can be carried via a network interface using any type of wired or wireless connection, using a variety of communication protocols (e.g., TCP/IP, HTTP, SMTP, FTP), encodings or formats (e.g., HTML, XML, JSON), or protection schemes (e.g., VPN, secure HTTP, SSL).

This disclosure makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, processes disclosed as being implemented by a server may be implemented using a single server or multiple servers working in combination. Databases and applications may be implemented on a single system or distributed across multiple systems. Distributed components may operate sequentially or in parallel.

In situations in which the systems and methods disclosed access and analyze personal information about users, or make use of personal information, such as location information, the users may be provided with an opportunity to control whether programs or features collect the information and control whether or how to receive content from the system or other application. No such information or data is collected or used until the user has been provided meaningful notice of what information is to be collected and how the information is used. The information is not collected or used unless the user provides consent, which can be revoked or modified by the user at any time. Thus, the user can have control over how information is collected about the user and used by the application or system. In addition, certain information or data can be treated in one or more ways before it is stored or used, so that personally identifiable information is removed. For example, a user's identity may be treated so that no personally identifiable information can be determined for the user.

Example Methods

Figure 5:
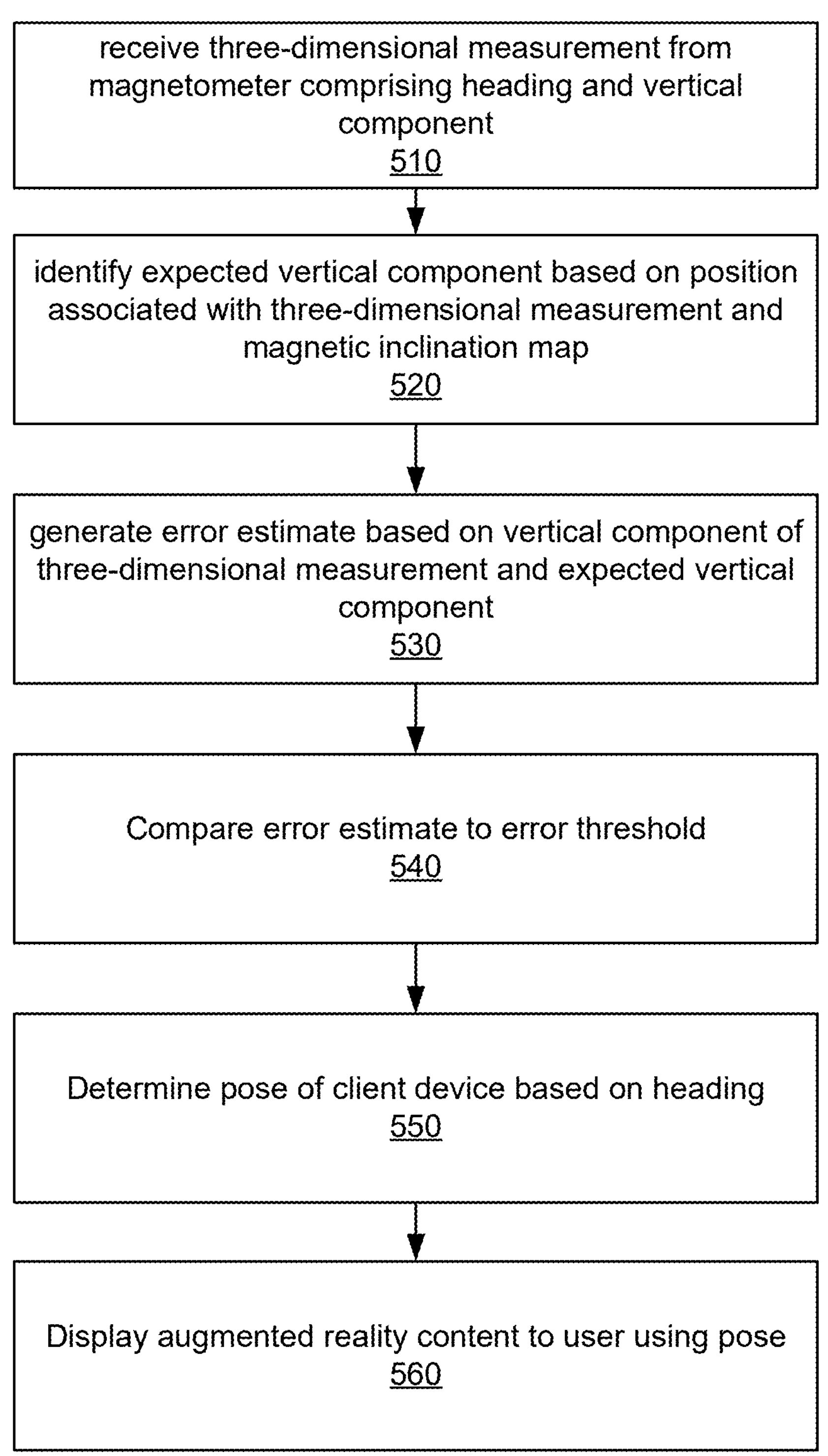
FIG. 5 is a flowchart describing an example method of estimating the error of magnetometer heading measurements, according to one embodiment.

FIG. 5 is a flowchart describing an example method 500 of estimating the error of magnetometer heading measurements, according to one embodiment. The steps of FIG. 5 are illustrated from the perspective of the client device 310 performing the method 500. However, some or all of the steps may be performed by other entities or components. In addition, some embodiments may perform the steps in parallel, perform the steps in different orders, or perform different steps.

In the embodiment shown, the method 500 begins with the client device 310 receiving 510 a three-dimensional measurement from a magnetometer. The three-dimensional measurement includes a heading and a vertical component. The client device 310 may adjust the three-dimensional measurement such that the vertical component is measured relative to gravity. For example, the client device 310 may detect the up-direction using accelerometer, gyroscope, or image data and adjust the vertical component based on the "up" direction.

The client device 310 identifies 520 an expected vertical component based on a position associated with the three-dimensional measurement and a world magnetic map. The position associated with the measurement may be the position of the magnetometer of the position of the client device 310. The client device 310 may identify the position of the magnetometer or client device 310 using the positioning module 316, for example by using a GPS device. The client device 310 uses the world magnetic map to map the position to expected vertical components. For example, the client device 310 may use a magnetic inclination map to map the position to an angle of the vertical component.

The client device 310 generates 530 an error estimate based on the vertical component of the three-dimensional measurement and the expected vertical component. The client device 310 computes an error in the vertical component by comparing the angle of the vertical component measured by the magnetometer to the expected angle of the vertical component given by the magnetic inclination map at the position of the magnetometer or client device 310. The client device 310 may estimate the error in the heading based on the error in angle of the vertical component. The client device 310 may, in some embodiments, generate an error estimate by applying the error model 430 to the measured and expected vertical components. The error model may be a machine learning model or a statistical model (e.g., a normal distribution or a Bayesian model).

The client device 310 compares 540 the error estimate to a threshold. In response to the error estimate being less than an error threshold 550, the client device 310 determines 550 a pose of the client device 310 based on the heading. The client device 310 may use the heading along with a location generated by the positioning module 316 to select a 3D map of the environment surrounding the client device 310 and localize against the 3D map. The client device 310 may use the heading as an additional input to the trained pose model. The client device 310 displays 560 augmented reality content to the user using the pose.

Example Magnetometer Data

Figure 6:
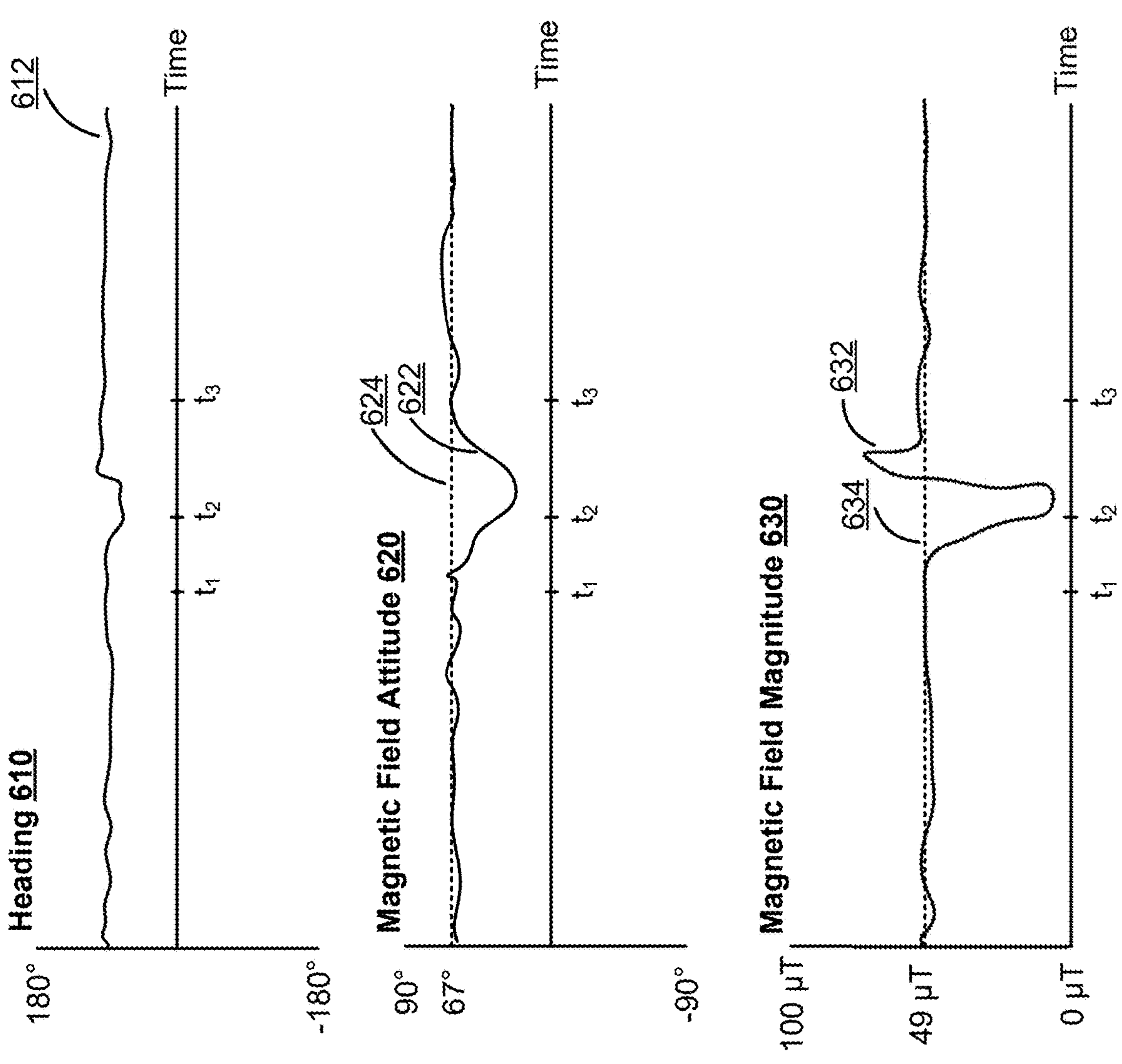
FIG. 6 illustrates example magnetometer data, according to one embodiment.

FIG. 6 illustrates example magnetometer data, according to one embodiment. FIG. 6 includes three plots: a plot of heading 610 that shows the heading (in degrees) of the client device 310 over time, a plot of magnetic field attitude 620 that shows the angle of the vertical component 620 (in degrees) of the client device 310 over time, and a plot of the magnetic field magnitude 630 that shows the magnitude of the three-dimensional measurement (in μT) over time. The solid lines show the measured magnetometer data, including the measured heading 612, measured angle of the vertical component 622, and the measured magnitude of the three-dimensional measurement 632. The dashed lines show the expected angle of the vertical component 624 (67 degrees) and the expected magnitude of the three-dimensional measurement 634 (49 μT). The data shown in the three plots is data taken simultaneously as a user moves the client device 310 with a heading of about 90 degrees (true east).

From around time $t_1$ to time $t_3$ the client device passes a magnetic object, for example a parked vehicle. The parked vehicle affects the magnetometer data, causing the heading 612 to deviate from 90 degrees, the measured angle 622 to deviate from the expected angle 624, and the measured magnitude 632 to deviate from the expected magnitude 634. The error estimation module 420 may estimate the error in the heading by comparing the measured angle 622 and the expected angle 632 or the measured magnitude 632 and the expected magnitude 634. For example, for the measurement taken at time $t_1$, the error estimation module 420 may estimate a low error, as the differences between the measured and expected angles and magnitudes are small. For the measurement taken at time $t_2$, the error estimation module 420 may estimate a high error, as the differences between the measured and expected angles and magnitudes are large. The error estimation module 420 may use the estimated error inform how the heading is used in calculation of the client device's pose. For example, as the error is high between times $t_1$ and $t_3$, the error estimation module 420 may ignore the heading measurements taken between times $t_1$ and $t_3$. The error estimate module 420 may thus achieve a more accurate estimation of the heading, around 90 degrees (true east).

Example Magnetic Mappings

FIGS. 7 and 8 are example magnetic mappings. FIG. 7 is an example of the magnetic inclination map from the WMM. FIG. 8 is an example of the magnetic field strength map from the WMM. The magnetic inclination map of FIG. 7 maps positions on Earth to the vertical angle of the Earth's magnetic field, or the "inclination." At the geographic north pole of the Earth (the magnetic south pole), the magnetic inclination is 90 degrees. At the geographic south pole of the Earth (the magnetic north pole), the magnetic inclination is −90 degrees. The magnetic field strength map of FIG. 8 maps positions on Earth to the magnitude of the Earth's magnetic field, with magnetic field intensity values ranging from under 23,000 nT to over 66,000 nT.

Example Computing System

Figure 9:
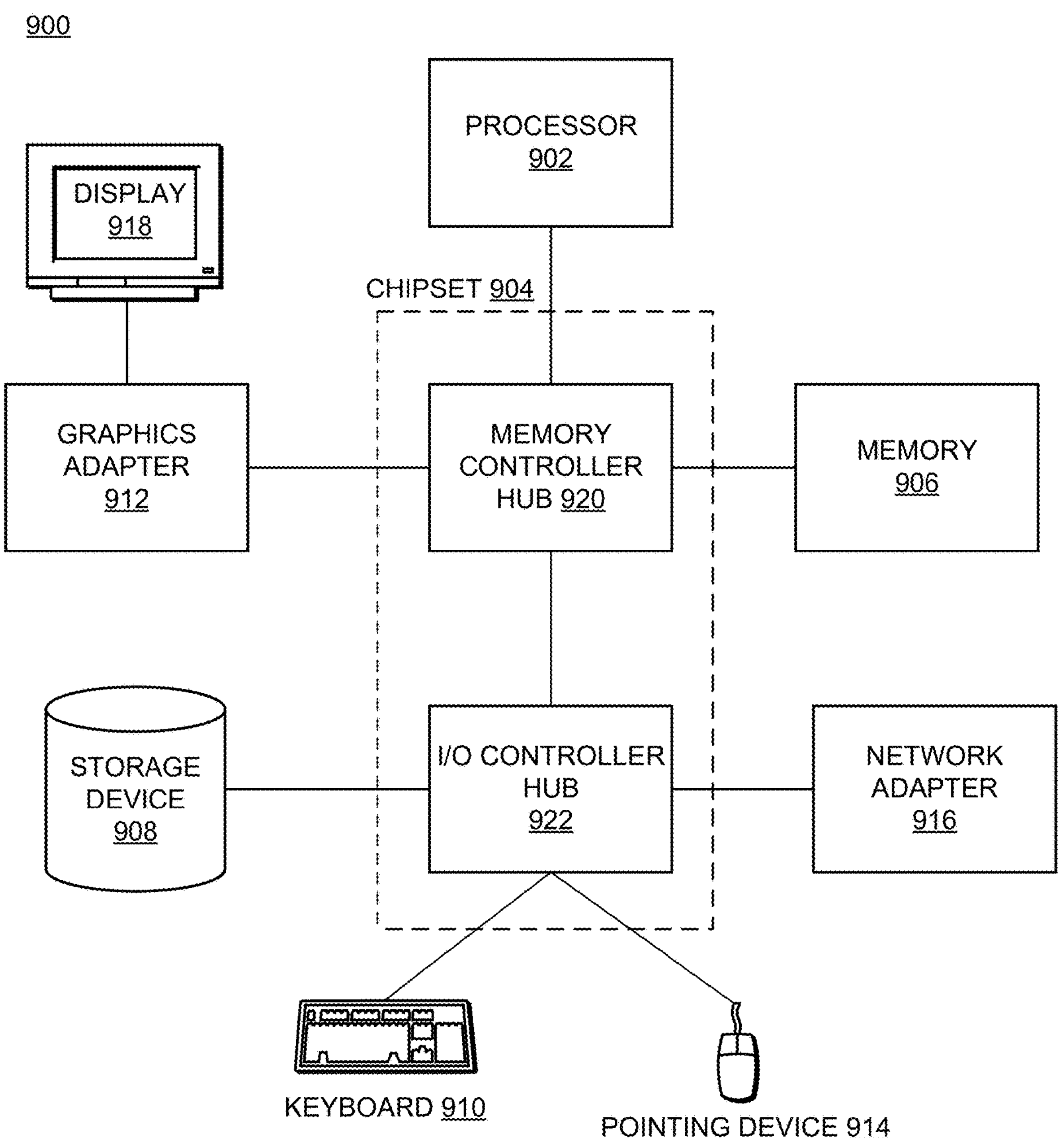
FIG. 9 illustrates an example computer system suitable for use in the networked computing environment of FIG. 1, according to one embodiment.

FIG. 9 is a block diagram of an example computer 900 suitable for use as a client device 310 or game server 320. The example computer 900 includes at least one processor 902 coupled to a chipset 904. References to a processor (or any other component of the computer 900) should be understood to refer to any one such component or combination of such components working cooperatively to provide the described functionality. The chipset 904 includes a memory controller hub 920 and an input/output (I/O) controller hub 922. A memory 906 and a graphics adapter 912 are coupled to the memory controller hub 920, and a display 918 is coupled to the graphics adapter 912. A storage device 908, keyboard 910, pointing device 914, and network adapter 916 are coupled to the I/O controller hub 922. Other embodiments of the computer 900 have different architectures.

In the embodiment shown in FIG. 9, the storage device 908 is a non-transitory computer-readable storage medium such as a hard drive, compact disk read-only memory (CD-ROM), DVD, or a solid-state memory device. The memory 906 holds instructions and data used by the processor 902. The pointing device 914 is a mouse, track ball, touch-screen, or other type of pointing device, and may be used in combination with the keyboard 910 (which may be an on-screen keyboard) to input data into the computer system 900. The graphics adapter 912 displays images and other information on the display 918. The network adapter 916 couples the computer system 900 to one or more computer networks, such as network 370.

The types of computers used by the entities of FIGS. 3 and 4 can vary depending upon the embodiment and the processing power required by the entity. For example, the game server 320 might include multiple blade servers working together to provide the functionality described. Furthermore, the computers can lack some of the components described above, such as keyboards 910, graphics adapters 912, and displays 918.

Additional Considerations

Some portions of above description describe the embodiments in terms of algorithmic processes or operations. These algorithmic descriptions and representations are commonly used by those skilled in the computing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality.

Any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment. Similarly, use of "a" or "an" preceding an element or component is done merely for convenience. This description should be understood to mean that one or more of the elements or components are present unless it is obvious that it is meant otherwise.

Where values are described as "approximate" or "substantially" (or their derivatives), such values should be construed as accurate +/−10% unless another meaning is apparent from the context. From example, "approximately ten" should be understood to mean "in a range from nine to eleven."

The terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Upon reading this disclosure, those of skill in the art will appreciate still additional alternative structural and functional designs for a system and a process for providing the described functionality. Thus, while particular embodiments and applications have been illustrated and described, it is to be understood that the described subject matter is not limited to the precise construction and components disclosed. The scope of protection should be limited only by the following claims.

What is claimed is:

1. A computer-implemented method comprising:

receiving a three-dimensional measurement from a magnetometer coupled to a client device, the three-dimensional measurement being a measurement captured by the magnetometer of the client device of a magnetic field and comprising a heading and a vertical component;

identifying an expected vertical component based on a position associated with the three-dimensional measurement and a world magnetic map, the world magnetic map mapping positions to expected vertical components; and generating an error estimate based on the vertical component of the three-dimensional measurement and the expected vertical component;

comparing the error estimate to an error threshold; and responsive to the error estimate being less than an error threshold:

determining a pose of the client device based on the heading, wherein determining the pose of the client device based on the heading comprises weighting the heading based on the error estimate, and displaying augmented reality content to a user using the pose, wherein displaying the augmented reality content comprises updating a display of the client device to present the augmented reality content.

2. The computer-implemented method of claim 1, further comprising:

receiving a second three-dimensional measurement from the magnetometer coupled to the client device, the second three-dimensional measurement being a measurement of the magnetic field and comprising a second heading and a second vertical component;

identifying a second expected vertical component based on a second position associated with the second three-dimensional measurement and the world magnetic map;

generating a second error estimate based on the second vertical component of the second three-dimensional measurement and the second expected vertical component;

selecting one of the first heading and the second heading based on which of the first error and the second error is lower; and determining a pose of the client device based on the selected heading.

3. The computer-implemented method of claim 2, wherein the second position is within a threshold distance from the first position.

4. The computer-implemented method of claim 1, wherein the vertical component is measured relative to gravity.

5. The computer-implemented method of claim 1, wherein generating an error estimate based on the vertical component of the three-dimensional measurement and the expected vertical component comprises applying an error model to the vertical component of the three-dimensional measurement and the expected vertical component.

6. The computer-implemented method of claim 5, wherein the error model is a Bayesian model.

7. The computer-implemented method of claim 5, wherein the error model is a normal distribution.

8. A non-transitory, computer-readable medium storing instructions that, when executed by a computing system, cause the computing system to perform operations comprising:

receiving a three-dimensional measurement from a magnetometer coupled to a client device, the three-dimensional measurement being a measurement captured by the magnetometer of the client device of a magnetic field and comprising a heading and a vertical component;

identifying an expected vertical component based on a position associated with the three-dimensional measurement and a world magnetic map, the world magnetic map mapping positions to expected vertical components; and generating an error estimate based on the vertical component of the three-dimensional measurement and the expected vertical component;

comparing the error estimate to an error threshold; and responsive to the error estimate being less than an error threshold:

determining a pose of the client device based on the heading, wherein determining the pose of the client device based on the heading comprises weighting the heading based on the error estimate, and displaying augmented reality content to a user using the pose, wherein displaying the augmented reality content comprises updating a display of the client device to present the augmented reality content.

9. The non-transitory computer-readable medium of claim 8, further storing instructions that, when executed by the computing system, cause the computing system to perform operations comprising:

receiving a second three-dimensional measurement from the magnetometer coupled to the client device, the second three-dimensional measurement being a measurement of the magnetic field and comprising a second heading and a second vertical component;

identifying a second expected vertical component based on a second position associated with the second three-dimensional measurement and the world magnetic map;

generating a second error estimate based on the second vertical component of the second three-dimensional measurement and the second expected vertical component;

selecting one of the first heading and the second heading based on which of the first error and the second error is lower; and determining a pose of the client device based on the selected heading.

10. The non-transitory computer-readable medium of claim 9, wherein the second position is within a threshold distance from the first position.

11. The non-transitory computer-readable medium of claim 8, wherein the vertical component is measured relative to gravity.

12. The non-transitory computer-readable medium of claim 8, wherein the instruction for generating an error estimate based on the vertical component of the three-dimensional measurement and the expected vertical component comprises instructions that, when executed by the computing system, cause the computing system to perform operations comprising applying an error model to the vertical component of the three-dimensional measurement and the expected vertical component.

13. The non-transitory computer-readable medium of claim 12, wherein the error model is a Bayesian model.

14. The non-transitory computer-readable medium of claim 12, wherein the error model is a normal distribution.

15. A system comprising:

one or more processors; and a non-transitory, computer-readable medium storing instructions that, when executed by the one or more processors, cause the one or more processors to:

receive a three-dimensional measurement from a magnetometer coupled to a client device, the three-dimensional measurement captured by the magnetometer of the client device being a measurement of a magnetic field and comprising a heading and a vertical component;

identify an expected vertical component based on a position associated with the three-dimensional measurement and a world magnetic map, the world magnetic map mapping positions to expected vertical components; and generate an error estimate based on the vertical component of the three-dimensional measurement and the expected vertical component;

compare the error estimate to an error threshold; and responsive to the error estimate being less than an error threshold:

determine a pose of the client device based on the heading, wherein determining the pose of the client device based on the heading comprises weighting the heading based on the error estimate, and display augmented reality content to a user using the pose, wherein displaying the augmented reality content comprises updating a display of the client device to present the augmented reality content.

16. The system of claim 15, further storing instructions that, when executed by the one or more processors, cause the one or more processors to:

receive a second three-dimensional measurement from the magnetometer coupled to the client device, the second three-dimensional measurement being a measurement of the magnetic field and comprising a second heading and a second vertical component;

identify a second expected vertical component based on a second position associated with the second three-dimensional measurement and the world magnetic map;

generate a second error estimate based on the second vertical component of the second three-dimensional measurement and the second expected vertical component;

select one of the first heading and the second heading based on which of the first error and the second error is lower; and determine a pose of the client device based on the selected heading.

17. The system of claim 16, wherein the second position is within a threshold distance from the first position.

* * * * *